(12) United States Patent
Sung

(10) Patent No.: US 12,665,579 B2
(45) Date of Patent: Jun. 23, 2026

(54) RING VOLTAGE CONTROLLED OSCILLATOR AND ELECTRONIC CIRCUITS WITH THE RING VOLTAGE CONTROLLED OSCILLATOR

(71) Applicant: SK hynix Inc., Gyeonggi-do (KR)

(72) Inventor: Ki Hyuk Sung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/940,836

(22) Filed: Nov. 8, 2024

(65) Prior Publication Data

US 2025/0293672 A1     Sep. 18, 2025

(30) Foreign Application Priority Data

Mar. 15, 2024     (KR) ........................ 10-2024-0036771

(51) Int. Cl.
*H03K 3/03*          (2006.01)
*H03K 19/0175*    (2006.01)
(52) U.S. Cl.
CPC ... *H03K 3/0315* (2013.01); *H03K 19/017509* (2013.01)
(58) Field of Classification Search
CPC ................................................. H03K 3/0315
USPC ........................................................ 331/57
See application file for complete search history.

(56) References Cited

U.S. PATENT DOCUMENTS

| | | | | |
|---|---|---|---|---|
| 5,061,907 | A | * | 10/1991 | Rasmussen ........... H03L 7/0995 |
| | | | | 331/108 B |
| 6,489,821 | B1 | * | 12/2002 | Kurd ........................ H03L 7/099 |
| | | | | 331/34 |
| 10,079,597 | B1 | * | 9/2018 | Bellaouar ............ H10D 30/637 |
| 11,500,616 | B1 | * | 11/2022 | Wang ...................... G06F 7/588 |
| 2020/0373885 | A1 | * | 11/2020 | Appel ................ H03F 3/45179 |
| 2023/0138437 | A1 | | 5/2023 | Wu et al. |

* cited by examiner

*Primary Examiner* — Joseph Chang
(74) *Attorney, Agent, or Firm* — IP & T GROUP LLP

(57) ABSTRACT

A ring voltage controlled oscillator includes an inverter chain circuit including inverters disposed in stages, the inverters being coupled to each other in a chain form, and a level shift circuit configured to receive an output signal from the inverter chain circuit to output a level-shifted final output signal. The level shift circuit includes an output inverter including a PMOS transistor and an NMOS transistor, coupled in series between a power supply terminal and a ground voltage terminal, and a common mode voltage providing circuit configured to provide a common mode voltage to the output signal from the inverter chain circuit to generate an intermediate output signal, the common mode voltage being provided in different magnitudes depending on transistor corners of the NMOS transistor and the PMOS transistor. The output inverter receives and inverts the intermediate output signal to generate the level-shifted final output signal.

20 Claims, 5 Drawing Sheets

(A) THIRD OUTPUT SIGNAL (V3)

(B) FOURTH OUTPUT SIGNAL (V4)

(C) FINAL OUTPUT SIGNAL (VOUT)

(A) FOURTH OUTPUT SIGNAL (V4)

(B) FINAL OUTPUT SIGNAL(VOUT)

(A) FOURTH OUTPUT SIGNAL (V4)

(B) FINAL OUTPUT SIGNAL (VOUT)

FIG.5

RING VOLTAGE CONTROLLED OSCILLATOR AND ELECTRONIC CIRCUITS WITH THE RING VOLTAGE CONTROLLED OSCILLATOR

CROSS-REFERENCE TO RELATED APPLICATIONS

The present application claims priority under 35 U.S.C. 119(a) to Korean Patent Application No. 10-2024-0036771, filed on Mar. 15, 2024, which is incorporated herein by reference in its entirety.

BACKGROUND

1. Technical Field

Various embodiments of the present disclosure relate to voltage controlled oscillators and, more particularly, to a ring voltage controlled oscillator and electronic circuits with the ring voltage controlled oscillator.

2. Related Art

The voltage controlled oscillator (VCO) is one of the most important basic building blocks in analog and digital circuits. The voltage controlled oscillator can be implemented in a variety of ways. One of the VCOs is a ring oscillator-based VCO (hereinafter, referred to as "ring VCO"), which is commonly used in clock generation subsystems. The ring VCO is used in applications such as clock recovery circuits for serial data communications, disk-drive read channels, on-chip clock distribution, and integrated frequency synthesizers. In designing the ring VCO, there are many tradeoffs in terms of speed, power, area, and application domain.

SUMMARY

A ring voltage controlled oscillator according to an embodiment of the present disclosure may include an inverter chain circuit including a plurality of inverters disposed in a plurality of stages, the plurality of inverters being coupled to each other in a chain form, and a level shift circuit configured to receive an output signal from the inverter chain circuit to output a level-shifted final output signal. The level shift circuit may include an output inverter including a P-channel type MOS (PMOS) transistor and an N-channel type MOS (NMOS) transistor coupled in series between a power supply terminal and a ground voltage terminal, and a common mode voltage providing circuit configured to provide a common mode voltage to the output signal from the inverter chain circuit to generate an intermediate output signal, the common mode voltage being provided in different magnitudes depending on transistor corners of the NMOS transistor and the PMOS transistor. The output inverter receives and inverts the intermediate output signal to generate the level-shifted final output signal.

An electronic circuit according to an embodiment of the present disclosure may include a phase frequency detector configured to receive a reference signal and a feedback signal and output an up signal or a down signal, based on a phase difference of the reference signal and the feedback signal, a charge pump configured to output a control voltage, based on the up signal or the down signal, a ring voltage controlled oscillator configured to generate and output an output signal with a frequency corresponding to the control voltage, and a divider configured to generate the feedback signal in which the frequency of the output signal is divided to transmit the feedback signal to the phase frequency detector. The ring voltage controlled oscillator may include an inverter chain circuit including a plurality of inverters disposed in a plurality of stages, and configured to receive the control voltage and output a first output signal, the plurality of inverters being coupled to each other in a chain form, and a level shift circuit configured to receive the first output signal to output a level-shifted final output signal. The level shift circuit may include an output inverter including a P-channel type MOS (PMOS) transistor and an N-channel type MOS (NMOS) transistor coupled in series between a power supply terminal and a ground voltage terminal, and a common mode voltage providing circuit configured to provide a common mode voltage to the first output signal from the inverter chain circuit to generate an intermediate output signal, the common voltage being provided in different magnitudes depending on transistor corners of the NMOS transistor and the PMOS transistor. The output inverter receives and inverts the intermediate output signal to generate the level-shifted final output signal.

BRIEF DESCRIPTION OF THE DRAWINGS

FIG. 1 is a circuit diagram illustrating a ring VCO according to an embodiment of the present disclosure.

FIG. 5 is a block diagram illustrating an electronic circuit according to an embodiment of the present disclosure.

DETAILED DESCRIPTION

Figure 2:
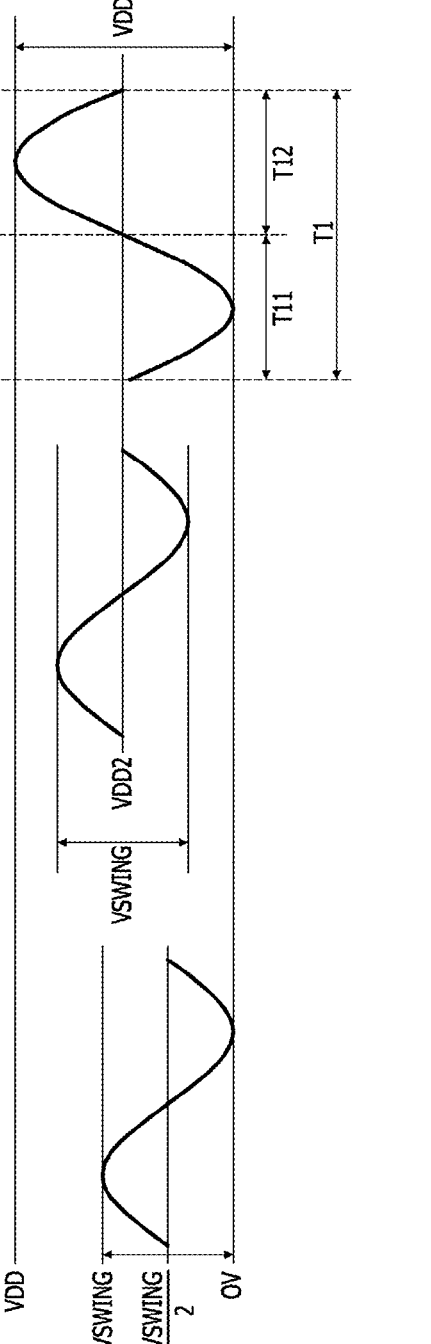
FIG. 2 is a waveform diagram illustrating a third output signal, a fourth output signal, and a final output signal when a seventh NMOS transistor and an eighth PMOS transistor included in an output inverter of FIG. 1 have one of transistor corners of typical-typical (TT), fast-fast (FF), and slow-slow (SS).

In the following description of embodiments, it will be understood that the terms "first" and "second" are intended to identify elements, but not used to define a particular number or sequence of elements. The description that one component is "connected" or "coupled" to another component may mean that it is directly connected or coupled electrically or mechanically to the other component, or other separate components may be interposed to form a connection or coupling relationship. The term "predetermined" means that when a parameter is used in a process or algorithm, the value of the parameter is predetermined. Depending on the embodiment, the numerical value of the parameter may be set when a process or algorithm starts or may be set during a section in which the process or algorithm is performed.

The terms "logic high level" and "logic low level" are used to describe logic levels of signals. Signals at a "logic high level" are distinguished from signals at a "logic low level." For example, when a signal having a first voltage corresponds to a "logic high level," a signal having a second voltage may correspond to a "logic low level." According to an embodiment, the "logic high level" may be set to a voltage greater than the "logic low level." Meanwhile, the logic levels of signals may be set to different logic levels or opposite logic levels depending on the embodiment. For example, a signal at a logic high level may be set to be at a logic low level depending on the embodiment, and a signal at a logic low level may be set to be at a logic high level depending on the embodiment.

Various embodiments of the present disclosure will be described hereinafter in more detail with reference to the accompanying drawings.

Figure 1:
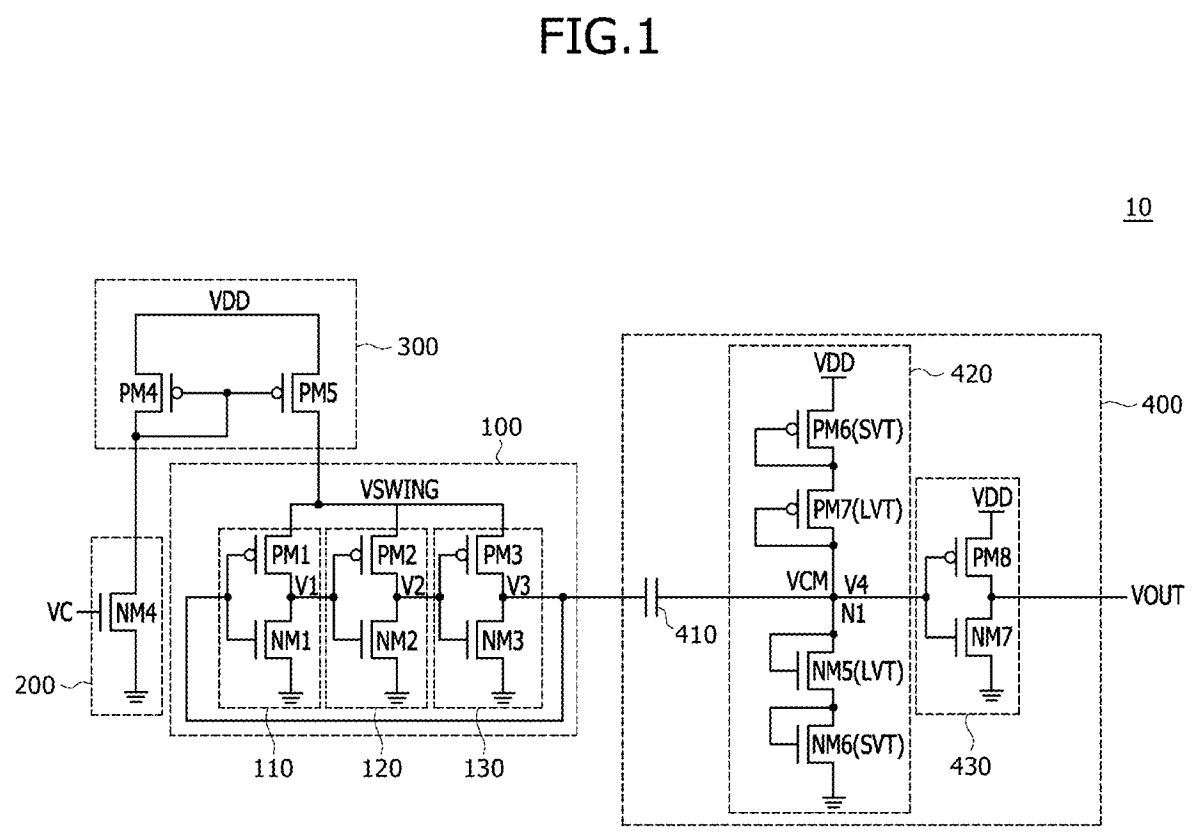

FIG. 1 is a circuit diagram illustrating a ring voltage controlled oscillator (VCO) 10 according to an embodiment of the present disclosure. Referring to FIG. 1, the ring VCO 10 includes an inverter chain circuit 100, a bias circuit 200, a current mirror circuit 300, and a level shift circuit 400. The ring VCO 10 receives a control voltage VC and outputs a final output signal VOUT having a specific frequency. The final output signal VOUT output from the ring VCO 10 may be tuned by the control voltage VC.

The inverter chain circuit 100 includes first, second, and third inverters 110, 120, and 130 disposed in a plurality of stages, for example, first, second, and third stages, respectively. The number of inverters included in the inverter chain circuit 100 may be an odd number greater than or equal to three. The first inverter 110 is disposed in the first stage of the inverter chain circuit 100. The second inverter 120 is disposed in the second stage of the inverter chain circuit 100. The third inverter 130 is disposed in the third stage, which is the last stage of the inverter chain circuit 100. The first, second, and third inverters 110, 120, and 130 are coupled to each other in a chain format. In addition, the first, second, and third inverters 110, 120, and 130 constitute a feedback loop. Accordingly, an output line of the first inverter 110 is coupled to an input line of the second inverter 120. An output line of the second inverter 120 is coupled to an input line of the third inverter 130. An output line of the third inverter 130 is coupled to an input line of the first inverter 110 and the level shift circuit 400.

The first inverter 110 of the first stage includes a first P-channel type MOS (hereinafter, referred to as "PMOS") transistor PM1 and a first N-channel type MOS (hereinafter, referred to as "NMOS") transistor NM1 coupled in series. A gate terminal of the first PMOS transistor PM1 and a gate terminal of the first NMOS transistor NM1 are commonly coupled to the input line of the first inverter 110 and the output line of the third inverter 130. A source terminal of the first PMOS transistor PM1 is coupled to the current mirror circuit 300. A drain terminal of the first PMOS transistor PM1 is coupled to the output line of the first inverter 110 and a drain terminal of the first NMOS transistor NM1. A source terminal of the first NMOS transistor NM1 is coupled to a ground voltage terminal to which a ground voltage is applied.

The second inverter 120 of the second stage includes a second PMOS transistor PM2 and a second NMOS transistor NM2 coupled in series. A gate terminal of the second PMOS transistor PM2 and a gate terminal of the second NMOS transistor NM2 are commonly coupled to the input line of the second inverter 120 and the output line of the first inverter 110. A source terminal of the second PMOS transistor PM2 is coupled to the current mirror circuit 300. A drain terminal of the second PMOS transistor PM2 is coupled to the output line of the second inverter 120 and a drain terminal of the second NMOS transistor NM2. A source terminal of the second NMOS transistor NM2 is coupled to the ground voltage terminal.

The third inverter 130 of the third stage includes a third PMOS transistor PM3 and a third NMOS transistor NM3 coupled in series. A gate terminal of the third PMOS transistor PM3 and a gate terminal of the third NMOS transistor NM3 are commonly coupled to the input line of the third inverter 130 and the output line of the second inverter 120. A source terminal of the third PMOS transistor PM3 is coupled to the current mirror circuit 300. A drain terminal of the third PMOS transistor PM3 is coupled to the output line of the third inverter 130 and a drain terminal of the third NMOS transistor NM3. A source terminal of the third NMOS transistor NM3 is coupled to the ground voltage terminal.

The bias circuit 200 includes a fourth NMOS transistor NM4. The control voltage VC is applied to a gate terminal of the fourth NMOS transistor NM4. The control voltage VC may be transmitted from an external circuit of the ring VCO 10 to the gate terminal of the fourth NMOS transistor NM4. A drain terminal of the fourth NMOS transistor NM4 is coupled to the current mirror circuit 300. A source terminal of the fourth NMOS transistor NM4 is coupled to the ground voltage terminal.

The current mirror circuit 300 includes a fourth PMOS transistor PM4 and a fifth PMOS transistor PM5 coupled in parallel. A gate terminal of the fourth PMOS transistor PM4 and a gate terminal of the fifth PMOS transistor PM5 are coupled to each other. A source terminal of the fourth PMOS transistor PM4 and a source terminal of the fifth PMOS transistor PM5 are coupled to a supply voltage terminal to which a supply voltage VDD is applied. A drain terminal of the fourth PMOS transistor PM4 is coupled to the drain terminal of the fourth NMOS transistor NM4 included in the bias circuit 200. The fourth PMOS transistor PM4 has a diode-connected MOS structure in which the drain terminal and the gate terminal are coupled to each other. A drain terminal of the fifth PMOS transistor PM5 is commonly coupled to the source terminal of the first PMOS transistor PM1 included in the first inverter 110, the source terminal of the second PMOS transistor PM2 included in the second inverter 120, and the source terminal of the third PMOS transistor PM3 included in the third inverter 130.

When the control voltage VC is applied to the gate terminal of the fourth NMOS transistor NM4 included in the bias circuit 200, the fourth NMOS transistor NM4 provides the current corresponding to the control voltage VC to the current mirror circuit 300. Specifically, as the gate terminal and drain terminal of the fourth PMOS transistor PM4 included in the current mirror circuit 300 are coupled to each other, the current corresponding to the control voltage VC flows through the fourth PMOS transistor PM4 and the fourth NMOS transistor NM4. The current flowing through the fourth PMOS transistor PM4 and the fourth NMOS transistor NM4 is mirrored to the fifth PMOS transistor PM5. The amount of the mirrored current can be adjusted by controlling the ratio W/L of the channel width W and channel length L of each of the fourth PMOS transistor PM4 and the fifth PMOS transistor PM5. The mirrored current flowing through the fifth PMOS transistor PM5 is provided, as a reference current, to the source terminal of the first PMOS transistor PM1, the source terminal of the second PMOS transistor PM2, and the source terminal of the third PMOS transistor PM3 included in the inverter chain circuit 100. As the reference current is provided to the source terminal of the first PMOS transistor PM1, the source terminal of the second PMOS transistor PM2, and the source terminal of the third PMOS transistor PM3, the source terminal of the first PMOS transistor PM1, the source terminal of the second PMOS transistor PM2, and the source terminal of the third PMOS transistor PM3 are biased to a swing voltage VSWING.

While the first PMOS transistor PM1 is in a triode region and the first NMOS transistor NM1 is in a cut-off region, a first output signal V1 output from the first inverter 110 has a magnitude of the swing voltage VSWING. After a certain period of time, when the first PMOS transistor PM1 is in the cut-off region and the first NMOS transistor NM1 is in the triode region, the first output signal V1 output from the first inverter 110 has a magnitude of the ground voltage. That is, the first output signal V1 of the first inverter 110 swings from the swing voltage VSWING to the ground voltage. Because the output line of the first inverter 110 is coupled to the input line of the second inverter 120, when the first output signal V1 from the first inverter 110 is a signal of a logic "high" level, a second output signal V2 from the second inverter 120 becomes a signal of a logic "low" level. Because the output line of the second inverter 120 is coupled to the input line of the third inverter 130, when the second output signal V2 from the second inverter 120 is a signal of a logic "low" level, a third output signal V3 from the third inverter 130 becomes a signal of a logic "high" level. Because the output line of the third inverter 130 is coupled to the input line of the first inverter 110, the first output signal V1 from the first inverter 110 transitions from a logic "high" level to a logic "low" level. Because the number of inverters is odd number and the first inverter 110 of the first stage receives the third output signal V3 from the third inverter 130 of the last stage as an input signal, the third output signal V3 output to the output line of the third inverter 130 becomes an oscillating signal.

The level shift circuit 400 includes a capacitor 410, a common mode voltage providing circuit 420, and an output inverter 430. The capacitor 410 has a first terminal and a second terminal. The first terminal of the capacitor 410 is coupled to the output line of the inverter chain circuit 100, that is, the output terminal of the third inverter 130. The second terminal of the capacitor 410 is coupled to a first node N1 of the common mode voltage providing circuit 420. An alternating current (AC) component of the third output signal V3 output from the third inverter 130 of the inverter chain circuit 100 is transmitted to the first node N1 of the common mode voltage providing circuit 420 through the capacitor 410. The common mode voltage providing circuit 420 provides a common mode voltage VCM to the first node N1. Accordingly, the fourth output signal V4 in which the third output signal V3 swings with respect to the common mode voltage VCM is transmitted to the output inverter 430 from the first node N1 of the common mode voltage providing circuit 420. The common mode voltage providing circuit 420 includes a pull-up circuit and a pull-down circuit. The pull-up circuit is disposed between the supply voltage terminal to which the supply voltage VDD is applied and the first node N1. The pull-down circuit is disposed between the first node N1 and the ground voltage terminal to which the ground voltage is applied. The pull-up circuit includes a sixth PMOS transistor PM6 and a seventh PMOS transistor PM7 that are coupled in series between the supply voltage terminal and the first node N1. The pull-down circuit includes a fifth NMOS transistor NM5 and a sixth NMOS transistor NM6 that are coupled in series between the first node N1 and the ground voltage terminal.

The sixth PMOS transistor PM6 and the sixth NMOS transistor NM6 included in the pull-up circuit and the pull-down circuit of the common mode voltage providing circuit 420, respectively, have standard voltage threshold (hereinafter, referred to as "SVT") characteristics. The seventh PMOS transistor PM7 and the fifth NMOS transistor NM5 included in the pull-up circuit and the pull-down circuit of the common mode voltage providing circuit 420, respectively, have low voltage threshold (hereinafter, referred to as "LVT") characteristics. A MOS transistor with LVT characteristics has a lower threshold voltage than a MOS transistor with SVT characteristics. In an embodiment, the MOS transistor with LVT characteristics can be manufactured by reducing the channel doping concentration compared to the MOS transistor with SVT characteristics. A switching frequency of the MOS transistor with LVT characteristics is greater than that of the MOS transistor with SVT characteristics. That is, the MOS transistor with LVT characteristics exhibits smaller delay characteristics than the MOS transistor with SVT characteristics.

Each of the sixth PMOS transistor PM6, the seventh PMOS transistor PM7, the fifth NMOS transistor NM5, and the sixth NMOS transistor NM6 that are included in the common mode voltage providing circuit 420 has the diode-connected MOS structure in which a gate terminal and a drain terminal are directly connected to each other. Accordingly, each of the sixth PMOS transistor PM6, the seventh PMOS transistor PM7, the fifth NMOS transistor NM5, and the sixth NMOS transistor NM6 included in the common mode voltage providing circuit 420 operates in a saturation region and acts as a diode resistor. As the pull-up circuit of the common mode voltage providing circuit 420 includes the sixth PMOS transistor PM6 with SVT characteristics and the seventh PMOS transistor PM7 with LVT characteristics and the pull-down circuit of the common mode voltage providing circuit 420 includes the sixth NMOS transistor NM6 with SVT characteristics and the fifth NMOS transistor NM5 with LVT characteristics, the common mode voltage VCM applied to the first node N1 may become greater or less than half the supply voltage VDD, that is, VDD/2.

In an embodiment, when the sum of the diode resistance of the sixth PMOS transistor PM6 and the diode resistance of the seventh PMOS transistor PM7 is equal to the sum of the diode resistance of the fifth NMOS transistor NM5 and the diode resistance of the sixth NMOS transistor NM6, the common mode voltage VCM of a magnitude of VDD/2 is provided to the first node N1 of the common mode voltage providing circuit 420. In another embodiment, when the sum of the diode resistance of the sixth PMOS transistor PM6 and the diode resistance of the seventh PMOS transistor PM7 is greater than the sum of the diode resistance of the fifth NMOS transistor NM5 and the diode resistance of the sixth NMOS transistor NM6, the common mode voltage VCM of a magnitude less than VDD/2 is provided to the first node N1 of the common mode voltage providing circuit 420. In another embodiment, when the sum of the diode resistance of the sixth PMOS transistor PM6 and the diode resistance of the seventh PMOS transistor PM7 is less than the sum of the diode resistance of the fifth NMOS transistor NM5 and the diode resistance of the sixth NMOS transistor NM6, the common mode voltage VCM of a magnitude greater than VDD/2 is provided to the first node N1 of the common mode voltage providing circuit 420.

In an embodiment, it is assumed that the sixth PMOS transistor PM6 and the sixth NMOS transistor NM6 have the same diode resistance. In this case, the diode resistance of the seventh PMOS transistor PM7 and the diode resistance of the fifth NMOS transistor NM5 may be set to have different values depending on the threshold voltage and channel width/channel length (hereinafter, referred to as "W/L"). In an example, in a case that the seventh PMOS transistor PM7 and the fifth NMOS transistor NM5 have the same threshold voltage, when the ratio of W/L of the sixth PMOS transistor PM6 and the seventh PMOS transistor PM7 is less than the ratio of W/L of the sixth NMOS transistor NM6 and the fifth NMOS transistor NM5, the seventh PMOS transistor PM7 has a diode resistance greater than that of the fifth NMOS transistor NM5. Therefore, in this case, the common mode voltage VCM of a magnitude less than VDD/2 is provided to the first node N1 of the common mode voltage providing circuit 420. On the other hand, when the ratio of W/L of the sixth PMOS transistor PM6 and the seventh PMOS transistor PM7 is greater than the ratio of W/L of the sixth NMOS transistor NM6 and the fifth NMOS transistor NM5, the seventh PMOS transistor PM7 has a diode resistance less than that of the fifth NMOS transistor NM5. Therefore, in this case, the common mode voltage VCM of a magnitude greater than VDD/2 is provided to the first node N1 of the common mode voltage providing circuit 420.

In another example, in a case that the ratio of W/L of the sixth PMOS transistor PM6 and the seventh PMOS transistor PM7 and the ratio of W/L of the sixth NMOS transistor NM6 and the fifth NMOS transistor NM5 are the same, when the threshold voltage of the seventh PMOS transistor PM7 is greater than that of the fifth NMOS transistor NM5, the seventh PMOS transistor PM7 has a diode resistance greater than that of the fifth NMOS transistor NM5. Therefore, in this case, the common mode voltage VCM of a magnitude less than VDD/2 is provided to the first node N1 of the common mode voltage providing circuit 420. When the threshold voltage of the seventh PMOS transistor PM7 is less than that of the fifth NMOS transistor NM5, the seventh PMOS transistor PM7 has a diode resistance less than that of the fifth NMOS transistor NM5. Therefore, in this case, the common mode voltage VCM of a magnitude greater than VDD/2 is provided to the first node N1 of the common mode voltage providing circuit 420.

The output inverter 430 receives a signal that is output from the inverter chain circuit 100 and transmitted through the capacitor 410 and the common mode voltage providing circuit 420, and outputs the final output signal VOUT whose amplitude is increased by a difference between the supply voltage VDD and the ground voltage, that is, the supply voltage VDD. In an embodiment, the output inverter 430 includes an eighth PMOS transistor PM8 and a seventh NMOS transistor NM7. A gate terminal of the eighth PMOS transistor PM8 and a gate terminal of the seventh NMOS transistor NM7 are commonly coupled to the first node N1 of the common mode voltage providing circuit 420. A source terminal of the eighth PMOS transistor PM8 is coupled to the supply voltage terminal. A drain terminal of the eighth PMOS transistor PM8 is coupled to an output line of the output inverter 430 and a drain terminal of the seventh NMOS transistor NM7. A source terminal of the seventh NMOS transistor NM7 is coupled to the ground voltage terminal.

In an embodiment, when the transistor corner of the eighth PMOS transistor PM8 included in the output inverter 430 is the same as the transistor corner of the seventh NMOS transistor NM7, the time period when the final output signal VOUT is at logic "high" level and the time period when the final output signal VOUT is at logic "low" level is the same. That is, the final output signal VOUT has a duty ratio of 50%. The transistor corner may be defined as the speed characteristics of the seventh NMOS transistor NM7 and the eighth PMOS transistor PM8. The transistor corner may mean at least one of a process corner in which a speed difference is caused during the manufacturing process, a voltage corner in which the speed difference is caused by the used voltage, and a temperature corner in which the speed difference is caused by temperature. The seventh NMOS transistor NM7 and the eighth PMOS transistor PM8 may have one of five transistor corners of typical-typical (hereinafter, referred to as "TT"), fast-fast (hereinafter, referred to as "FF"), slow-slow (hereinafter, referred to as "SS"), fast-slow (hereinafter, referred to as "FS"), and slow-fast (hereinafter, referred to as "SF"). When the seventh NMOS transistor NM7 and the eighth PMOS transistor PM8 have one of the transistor corners of TT, FF, and SS, the speed characteristics of the seventh NMOS transistor NM7 and eighth PMOS transistor PM8 are equal to each other. In this case, the duty ratio of the final output signal VOUT becomes 50%.

On the other hand, when the seventh NMOS transistor NM7 and the eighth PMOS transistor PM8 have the transistor corner of FS or SF, the speed characteristics of the seventh NMOS transistor NM7 and eighth PMOS transistor PM8 are not equal. Accordingly, the duty ratio becomes less or more than 50%. For example, when the seventh NMOS transistor NM7 and the eighth PMOS transistor PM8 have the transistor corner of FS, the operation speed of the seventh NMOS transistor NM7 is faster than the operation speed of the eighth PMOS transistor PM8. In this case, the duty ratio of the final output signal VOUT becomes less than 50%. When the seventh NMOS transistor NM7 and the eighth PMOS transistor PM8 have the transistor corner of SF, the operation speed of the eighth PMOS transistor PM8 is faster than the operation speed of the seventh NMOS transistor NM7. In this case, the duty ratio of the final output signal VOUT becomes greater than 50%.

Even when the seventh NMOS transistor NM7 and eighth PMOS transistor PM8 included in the output inverter 430 have the transistor corner of FS or the transistor corner of SF, the duty ratio of the final output signal VOUT can be maintained at 50% at all times by adjusting the magnitude of the common mode voltage VCM in the common mode voltage providing circuit 420. For example, when the seventh NMOS transistor NM7 and eighth PMOS transistor PM8 included in the output inverter 430 have the transistor corner of FS, the duty ratio of the final output signal VOUT can be maintained at 50% by providing the common mode voltage VCM of a magnitude less than VDD/2 from the common mode voltage providing circuit 420. On the other hand, when the seventh NMOS transistor NM7 and eighth PMOS transistor PM8 included in the output inverter 430 have the transistor corner of SF, the duty ratio of the final output signal VOUT can be maintained at 50% by providing the common mode voltage VCM of a magnitude greater than VDD/2 from the common mode voltage providing circuit 420.

FIG. 2 is a waveform diagram illustrating the third output signal V3, the fourth output signal V4, and the final output signal VOUT when the seventh NMOS transistor NM7 and the eighth PMOS transistor PM8 included in the output inverter 430 in FIG. 1 have one of the transistor corners of TT, FF, and SS.

Referring to FIG. 2 along with FIG. 1, the third output signal V3 output from the inverter chain circuit 100 has an alternating current waveform with an amplitude corresponding to a difference between the ground voltage and the swing voltage VSWING. Hereinafter, it is assumed that the ground voltage is 0 V. As the third output signal V3 swings between 0 V and the swing voltage VSWING, the third output signal V3 has an amplitude corresponding to the swing voltage VSWING. As the seventh NMOS transistor NM7 and eighth PMOS transistor PM8 included in the output inverter 430 have the transistor corner of TT, FF, or SS, the common mode voltage providing circuit 420 is configured to provide to the first node N1 the common mode voltage VCM of a magnitude equal to VDD/2. That is, in the common mode voltage providing circuit 420, the diode resistances of the sixth PMOS transistor PM6 and the seventh PMOS transistor PM7 is the same as the diode resistances of the fifth NMOS transistor NM5 and the sixth NMOS transistor NM6. Accordingly, the fourth output signal V4 has an amplitude corresponding to the swing voltage VSWING and has a waveform of an alternating current signal that swings around the common mode voltage VCM of VDD/2.

When the fourth output signal V4 is applied to the gate terminals of the eighth PMOS transistor PM8 and the seventh NMOS transistor NM7 of the output inverter 430, the final output signal VOUT is output from the output terminal of the output inverter 430. The final output signal VOUT has a waveform of an alternating current signal that swings around the common mode voltage VCM of VDD/2. The final output signal VOUT has an opposite phase to the fourth output signal (i.e., an intermediate output signal) V4 and has an amplitude of VDD. As the seventh NMOS transistor NM7 and the eighth PMOS transistor PM8 included in the output inverter 430 have the transistor corner of TT, FF, or SS and the common mode voltage VCM of the fourth output signal V4 has a magnitude of VDD/2, the duty ratio of the final output signal VOUT becomes 50%. That is, the period T11 during which the final output signal VOUT is at a logic "low" level is identical to the period T12 during which the final output signal VOUT is at a logic "high" level, and the duty ratio, which is the ratio of the period T12 at the logic "high" level to the cycle T1 of the final output signal VOUT, becomes 50%.

Figure 3:
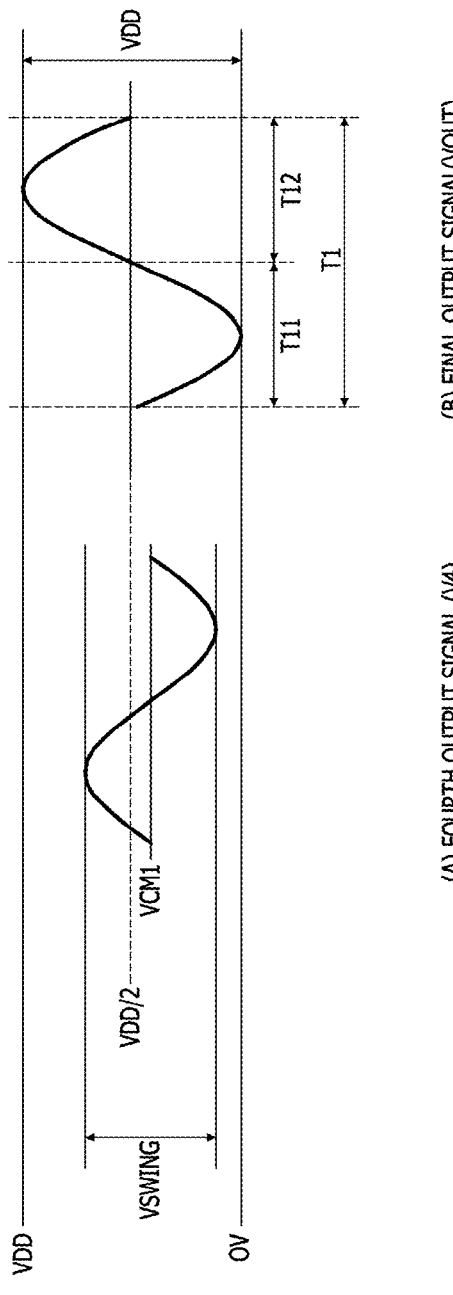
FIG. 3 is a waveform diagram illustrating the fourth output signal and the final output signal when the seventh NMOS transistor and the eighth PMOS transistor included in the output inverter of FIG. 1 have the transistor corner of fast-slow (FS).

FIG. 3 is a waveform diagram illustrating the fourth output signal V4 and the final output signal VOUT when the seventh NMOS transistor NM7 and the eighth PMOS transistor PM8 included in the output inverter 430 in FIG. 1 have the transistor corner of FS. As the third output signal V3 is the same as described with reference to FIG. 2, the third output signal V3 is omitted in FIG. 3.

Referring to FIG. 3 along with FIG. 1, as the seventh NMOS transistor NM7 and the eighth PMOS transistor PM8 included in the output inverter 430 have the transistor corner of FS, the common mode voltage providing circuit 420 is configured to provide to the first node N1 a first common mode voltage VCM1 of a magnitude less than VDD/2. That is, in the common mode voltage providing circuit 420, the diode resistances of the sixth PMOS transistor PM6 and the seventh PMOS transistor PM7 are greater than the diode resistances of the fifth NMOS transistor NM5 and the sixth NMOS transistor NM6. Accordingly, the fourth output signal V4 has an amplitude corresponding to the swing voltage VSWING and has a waveform of an AC signal that swings around the first common mode voltage VCM1 of a magnitude less than VDD/2.

When the fourth output signal V4 is applied to the gate terminals of the eighth PMOS transistor PM8 and seventh NMOS transistor NM7 of the output inverter 430, the final output signal VOUT is output from the output terminal of the output inverter 430. The final output signal VOUT has a waveform of an AC signal that swings around the common mode voltage VCM of a magnitude of VDD/2. The final output signal VOUT has an opposite phase to the fourth output signal V4 and has an amplitude corresponding to the VDD. As the seventh NMOS transistor NM7 and the eighth PMOS transistor PM8 included in the output inverter 430 have the transistor corner of FS and the first common mode voltage VCM1 of the fourth output signal V4 is less than VDD/2, the duty ratio of the final output signal VOUT becomes 50%. That is, the period T11 during which the final output signal VOUT is at a logic "low" level is identical to the period T12 during which the final output signal VOUT is at a logic "high" level, and the duty ratio, which is the ratio of the period T12 at the logic "high" level to the cycle T of the final output signal VOUT, becomes 50%.

More specifically, as described with reference to FIG. 2, it is assumed that the fourth output signal V4 transmitted to the output inverter 430 has the common mode voltage VCM of a magnitude of VDD/2. As the seventh NMOS transistor NM7 and the eighth PMOS transistor PM8 included in the output inverter 430 have the transistor corner of FS, the seventh NMOS transistor NM7 operates at a faster speed than the eighth PMOS transistor PM8. Therefore, in this case, the period during which the final output signal VOUT is at a logic "low" level becomes longer than the period during which the final output signal VOUT is at a logic "high" level, and therefore, the duty ratio of the final output signal VOUT becomes less than 50%. However, as in the present embodiment, when the fourth output signal V4 transmitted to the output inverter 430 through the common mode voltage providing circuit 420 has the first common mode voltage VCM1 of a magnitude less than VDD/2, the period T11 during which the final output signal VOUT is at a logic "low" level becomes shorter, and the period T12 during which the final output signal VOUT is at a logic "high" level becomes longer. Accordingly, the duty ratio, which is the ratio of the period T12 at the logic "high" level to the cycle T of the final output signal VOUT, becomes 50%.

Figure 4:
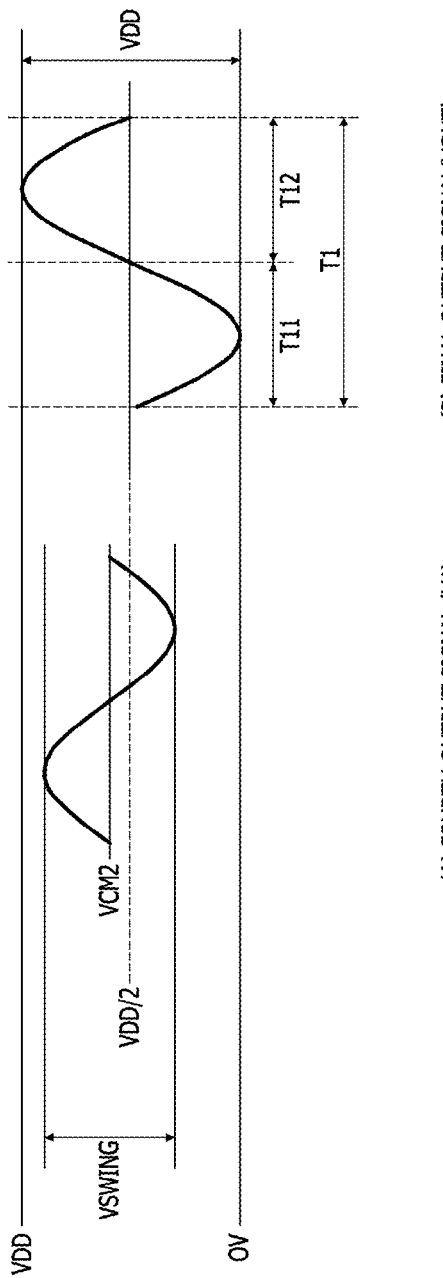
FIG. 4 is a waveform diagram illustrating the fourth output signal and the final output signal when the seventh NMOS transistor and the eighth PMOS transistor included in the output inverter of FIG. 1 have the transistor corner of slow-fast (SF).

FIG. 4 is a waveform diagram illustrating the fourth output signal V4 and the final output signal VOUT when the seventh NMOS transistor NM7 and the eighth PMOS transistor PM8 included in the output inverter 430 of FIG. 1 have the transistor corner of SF. As the third output signal V3 is the same as described with reference to FIG. 2, the third output signal V3 is omitted in FIG. 4.

Referring to FIG. 4, as the seventh NMOS transistor NM7 and the eighth PMOS transistor PM8 included in the output inverter 430 have the transistor corner of FS, the common mode voltage providing circuit 420 is configured to provide to the first node N1 a second common mode voltage VCM2 of a magnitude greater than VDD/2. That is, in the common mode voltage providing circuit 420, the diode resistances of the sixth PMOS transistor PM6 and seventh PMOS transistor PM7 are less than the diode resistances of the fifth NMOS transistor NM5 and sixth NMOS transistor NM6. Accordingly, the fourth output signal V4 has an amplitude corresponding to the swing voltage VSWING and has a waveform of an AC signal that swings around the second common mode voltage VCM2 of a magnitude greater than VDD/2.

When the fourth output signal V4 is applied to the gate terminals of the eighth PMOS transistor PM8 and seventh NMOS transistor NM7 of the output inverter 430, the final output signal VOUT is output from the output terminal of the output inverter 430. The final output signal VOUT has a waveform of an AC signal that swings around the common mode voltage VCM of a magnitude of VDD/2. The final output signal VOUT has an opposite phase to the fourth output signal V4 and has an amplitude corresponding to VDD. As the seventh NMOS transistor NM7 and the eighth PMOS transistor PM8 included in the output inverter 430 have the transistor corner of SF and the first common mode voltage VCM1 of the fourth output signal V4 is greater than VDD/2, the duty ratio of the final output signal VOUT becomes 50%. That is, the period T11 during which the final output signal VOUT is at a logic "low" level is identical to the period T12 during which the final output signal VOUT is at a logic "high" level, and the duty ratio, which is the ratio of the period T12 at the logic "high" level to the cycle T of the final output signal VOUT, becomes 50%.

More specifically, as described with reference to FIG. 2, it is assumed that the fourth output signal V4 transmitted to the output inverter 430 has the common mode voltage VCM of VDD/2. As the seventh NMOS transistor NM7 and eighth PMOS transistor PM8 included in the output inverter 430 have the transistor corner of SF, the seventh NMOS transistor NM7 operates at a slower speed than the eighth PMOS transistor PM8. Therefore, in this case, the period during which the final output signal VOUT is at a logic "low" level becomes shorter than the period during which the final output signal VOUT is at a logic "high" level, and therefore, the duty ratio of the final output signal VOUT becomes greater than 50%. However, as in the present embodiment, when the fourth output signal V4 transmitted to the output inverter 430 through the common mode voltage providing circuit 420 has the second common mode voltage VCM2 of a magnitude greater than VDD/2, the period T11 during which the final output signal VOUT is at a logic "high" level becomes longer and the period T12 during which the final output signal VOUT is at a logic "high" level becomes longer. Accordingly, the duty ratio, which is the ratio of the period T12 at the logic "high" level to the cycle T of the final output signal VOUT, becomes 50%.

Figure 5:
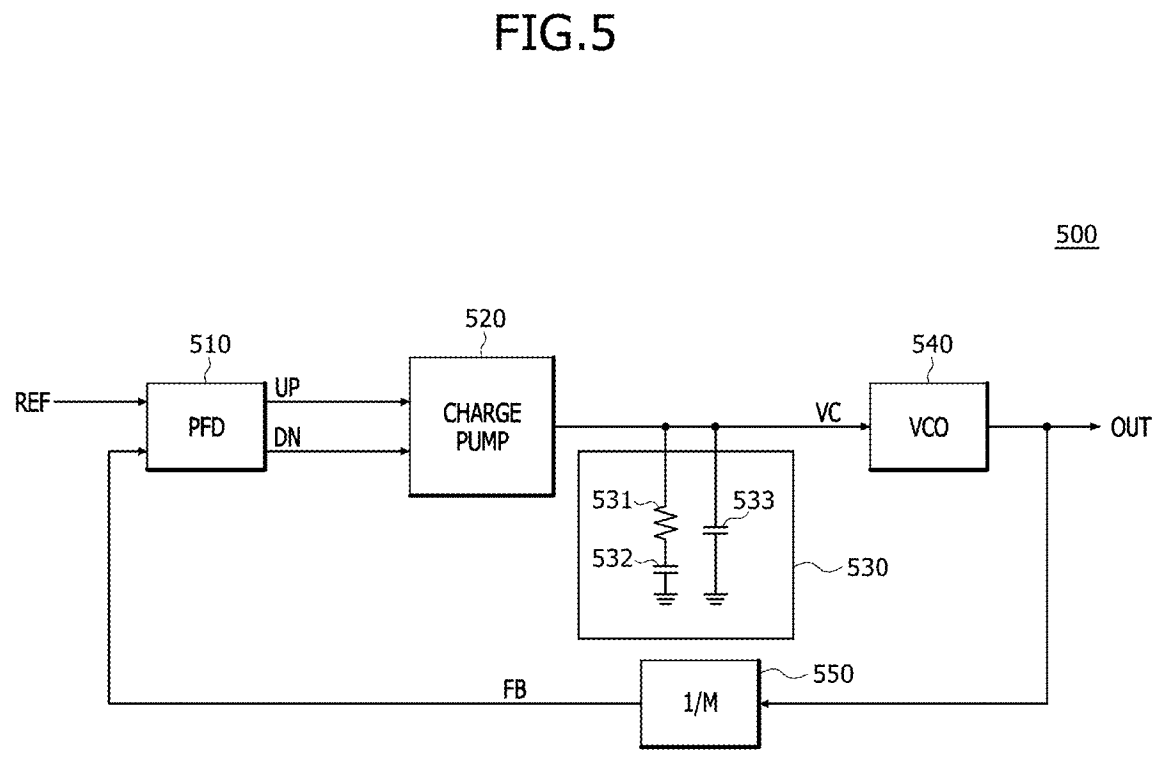

FIG. 5 is a block diagram illustrating a phase locked loop circuit 500 as an example of an electronic circuit including a ring voltage controlled oscillator according to the present disclosure.

Referring to FIG. 5, the phase locked loop circuit 500 includes a phase frequency detector (PFD) 510, a charge pump 520, a loop filter 530, a ring voltage controlled oscillator (VCO) 540, and a divider 550. The phase locked loop circuit 500 receives a reference signal REF and outputs an output signal OUT maintaining a constant frequency, based on the reference signal REF. The output signal OUT output from the phase locked loop circuit 500 is output from the ring VCO 540. The ring VCO 540 may have the same configuration as the ring VCO 10 described with reference to FIG. 1. Therefore, like the final output signal (VOUT in FIG. 1) output from the ring voltage controlled oscillator (10 in FIG. 1), even if the seventh NMOS transistor (NM7 in FIG. 1) and the eighth PMOS transistor (PM8 in FIG. 1) included in the output inverter (430 in FIG. 1) of the ring VCO (10 in FIG. 1) have the transistor corner of FS or SF, the output signal OUT has a duty ratio of 50%. Hereinafter, the description of the ring VCO 540 is omitted.

The phase frequency detector 510 receives the reference signal REF and a feedback signal FB. In an embodiment, the reference signal REF may be provided from a crystal oscillator. The phase frequency detector 510 detects a phase difference between the reference signal REF and the feedback signal FB and transmits the detected phase difference to the charge pump 520. In an embodiment, the phase frequency detector 510 outputs a pulse-type up-signal UP or down-signal DN during each cycle of the reference signal REF, based on the phase difference between the reference signal REF and the feedback signal FB. For example, when the phase of the reference signal REF leads the phase of the feedback signal FB, the phase frequency detector 510 outputs the up-signal UP. A width of the up-signal UP may be proportional to the phase difference between the reference signal REF and the feedback signal FB. When the phase of the reference signal REF lags the phase of the feedback signal FB, the phase frequency detector 510 outputs the down-signal DN. A width of the down-signal DN may also be proportional to the phase difference between the reference signal REF and the feedback signal FB.

The charge pump 520 outputs a control voltage VC, based on the up-signal UP or the down-signal DN provided from the phase frequency detector 510. In an embodiment, when the up-signal UP is transmitted from the phase frequency detector 510, the charge pump 520 outputs the control voltage VC increased by an amount corresponding to a charge amount corresponding to the pulse width of the up-signal UP. When the down-signal DN is transmitted from the phase frequency detector 510, the charge pump 520 outputs the control voltage VC reduced by an amount corresponding to a charge amount corresponding to the pulse width of the down-signal DN. In an embodiment, the charge pump 520 includes a first current source, a second current source, a first switch, and a second switch.

The loop filter 530 is disposed between the charge pump 520 and the ring VCO 540. In an embodiment, the loop filter 530 may be configured as a low-pass filter including a resistor 531 and capacitors 532 and 533, as shown in FIG. 5. The capacitors 532 and 533 of the loop filter 530 accumulate charges provided from the charge pump 520 or discharge accumulated charges to the charge pump 520. The operation of accumulating or discharging charges of the loop filter 530 is achieved by the operation of the charge pump 520 according to the up-signal UP or the down-signal DN output from the phase frequency detector 510. For example, when the up-signal UP is provided to the charge pump 520, the charge pump 520 pushes out the amount of charge corresponding to the pulse width of the up-signal UP, and the charge pushed out from the charge pump 520 is charged in the capacitors 532 and 533 of the loop filter 530. When the down-signal DN is provided to the charge pump 520, the charge pump 520 pulls the amount of charge corresponding to the pulse width of the down-signal DN, and thus, the charge accumulated in the capacitors 532 and 533 of the loop filter 530 is discharged to the charge pump 520. As the loop filter 530 is configured as a low-pass filter, harmonics and noise of the control voltage VC can be removed by the loop filter 530.

The ring VCO 540 receives the control voltage VC from the charge pump 520. The ring VCO 540 generates and outputs an output signal OUT, based on the control voltage VC. The configuration and operation of the ring VCO 540 are the same as those described with reference to FIGS. 1 to 4. Accordingly, the output signal OUT output from the ring VCO 540 may be the same as the final output signal VOUT output from the level shift circuit 400 of the ring VCO 10 described with reference to FIG. 1.

The divider 550 receives the output signal OUT output from the ring VCO 540. The divider 550 generates the feedback signal FB obtained by dividing the frequency of the output signal OUT by 1/M. Further, the divider 550 transmits the feedback signal FB to the phase frequency detector 510. In an embodiment, the frequency of the output signal OUT may be changed by changing the multiple (i.e., "M") used for division in the divider 550.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A ring voltage controlled oscillator comprising:
an inverter chain circuit including a plurality of inverters disposed in a plurality of stages, the plurality of inverters being coupled to each other in a chain form; and
a level shift circuit configured to receive an output signal from the inverter chain circuit to output a level-shifted final output signal,
wherein the level shift circuit includes:
an output inverter including a P-channel type MOS (PMOS) transistor and an N-channel type MOS (NMOS) transistor coupled in series between a power supply terminal and a ground voltage terminal; and
a common mode voltage providing circuit configured to provide a common mode voltage to the output signal from the inverter chain circuit to generate an intermediate output signal, the common mode voltage being provided in different magnitudes depending on transistor corners of the NMOS transistor and the PMOS transistor, and
wherein the output inverter receives and inverts the intermediate output signal to generate the level-shifted final output signal.

2. The ring voltage controlled oscillator of claim 1, wherein the level shift circuit further includes a capacitor disposed between the inverter chain circuit and the common mode voltage providing circuit to transmit an alternating current component of the output signal output from the inverter chain circuit to a first node of the common mode voltage providing circuit.

3. The ring voltage controlled oscillator of claim 2, wherein the common mode voltage providing circuit includes:
a pull-up circuit disposed between the supply voltage terminal to which a supply voltage is applied and the first node; and
a pull-down circuit disposed between the first node and the ground voltage terminal to which a ground voltage is applied.

4. The ring voltage controlled oscillator of claim 3,
wherein the pull-up circuit includes a first PMOS transistor and a second PMOS transistor that are disposed in series between the supply voltage terminal and the first node, and
wherein the pull-down circuit includes a first NMOS transistor and a second NMOS transistor that are disposed in series between the first node and the ground voltage terminal.

5. The ring voltage controlled oscillator of claim 4, wherein each of the first PMOS transistor, the second PMOS transistor, the first NMOS transistor, and the second NMOS transistor has a diode-connected MOS structure in which a gate terminal and a drain terminal of each transistor are coupled to each other.

6. The ring voltage controlled oscillator of claim 5,
wherein the first PMOS transistor and the second NMOS transistor have standard voltage threshold (SVT) characteristics, and
wherein the second PMOS transistor and the first NMOS transistor have low voltage threshold (LVT) characteristics.

7. The ring voltage controlled oscillator of claim 6, wherein a sum of diode resistances of the first PMOS transistor and the second PMOS transistor and a sum of diode resistances of the first NMOS transistor and the second NMOS transistor have the same value or different values depending on the transistor corner of the NMOS transistor and the PMOS transistor of the output inverter.

8. The ring voltage controlled oscillator of claim 6, wherein the common mode voltage control circuit is configured to apply to the first node the common mode voltage of half the magnitude of the supply voltage when the NMOS transistor and the PMOS transistor of the output inverter have one of the transistor corners of typical-typical (TT), fast-fast (FF), and slow-slow (SS).

9. The ring voltage controlled oscillator of claim 8,
wherein each of the first PMOS transistor and the second NMOS transistor has a first diode resistance, and
wherein each of the second PMOS transistor and the first NMOS transistor has a second diode resistance.

10. The ring voltage controlled oscillator of claim 6, wherein the common mode voltage control circuit is configured to apply to the first node the common mode voltage of a magnitude less than half of the supply voltage when the NMOS transistor and the PMOS transistor of the output inverter have the transistor corner of fast-slow (FS).

11. The ring voltage controlled oscillator of claim 10, wherein, when each of the first PMOS transistor and the second NMOS transistor has a first diode resistance and each of the second PMOS transistor and the first NMOS transistor has a second diode resistance, a ratio of channel width/channel length of the first PMOS transistor to the second PMOS transistor is less than a ratio of channel width/channel length of the second NMOS transistor to the first NMOS transistor.

12. The ring voltage controlled oscillator of claim 10, wherein, when each of the first PMOS transistor and the second NMOS transistor has a first diode resistance and a ratio of channel width/channel length of the first PMOS transistor to the second PMOS transistor is the same as a ratio of channel width/channel length of the second NMOS transistor to the first NMOS transistor, a threshold voltage of the second PMOS transistor is greater than a threshold voltage of the first NMOS transistor.

13. The ring voltage controlled oscillator of claim 6, wherein the common mode voltage control circuit is configured to apply to the first node the common mode voltage of a magnitude greater than half of the supply voltage when the NMOS transistor and the PMOS transistor of the output inverter have the transistor corner of slow-fast (SF).

14. The ring voltage controlled oscillator of claim 13, wherein, when the first PMOS transistor and the second NMOS transistor have a first diode resistance and the second PMOS transistor and the first NMOS transistor have a second diode resistance, a ratio of channel width/channel length of the first PMOS transistor to the second PMOS transistor is greater than a ratio of channel width/channel length of the second NMOS transistor to the first NMOS transistor.

15. The ring voltage controlled oscillator of claim 13, wherein, when each of the first PMOS transistor and the second NMOS transistor has a first diode resistance and a ratio of channel width/channel length of the first PMOS transistor to the second PMOS transistor is the same as a ratio of channel width/channel length of the second NMOS transistor to the first NMOS transistor, a threshold voltage of the second PMOS transistor is less than a threshold voltage of the first NMOS transistor.

16. An electronic circuit comprising:
a phase frequency detector configured to receive a reference signal and a feedback signal and output an up signal or a down signal, based on a phase difference of the reference signal and the feedback signal;
a charge pump configured to output a control voltage, based on the up signal or the down signal;
a ring voltage controlled oscillator configured to generate and output an output signal with a frequency corresponding to the control voltage; and
a divider configured to generate the feedback signal by dividing a frequency of the output signal to transmit the feedback signal to the phase frequency detector,
wherein the ring voltage controlled oscillator includes:
an inverter chain circuit including a plurality of inverters disposed in a plurality of stages, and configured to receive the control voltage and output a first output signal, the plurality of inverters being coupled to each other in a chain form; and
a level shift circuit configured to receive the first output signal to output a level-shifted final output signal, and
wherein the level shift circuit includes:
an output inverter including a P-channel type MOS (PMOS) transistor and an N-channel type MOS (NMOS) transistor coupled in series between a power supply terminal and a ground voltage terminal; and
a common mode voltage providing circuit configured to provide a common mode voltage to the first output signal to generate an intermediate output signal, the common voltage being provided in different magnitudes depending on transistor corners of the NMOS transistor and the PMOS transistor, and wherein the output inverter receives and inverts the intermediate output signal to generate the level-shifted final output signal.

17. The electronic circuit of claim 16,
wherein the common mode voltage providing circuit includes:
a first PMOS transistor and a second PMOS transistor that are disposed in series between the supply voltage terminal to which a supply voltage is applied and a first node; and
a first NMOS transistor and a second NMOS transistor that are disposed in series between the first node and the ground voltage terminal to which a ground voltage is applied,
wherein each of the first PMOS transistor, the second PMOS transistor, the first NMOS transistor, and the second NMOS transistor has a diode-connected MOS structure in which a gate terminal and a drain terminal of each transistor are coupled to each other, and
wherein the first PMOS transistor and the second NMOS transistor have standard voltage threshold (SVT) characteristics, and the second PMOS transistor and the first NMOS transistor have low voltage threshold (LVT) characteristics.

18. The electronic circuit of claim 17, wherein the common mode voltage control circuit is configured to apply to the first node the common mode voltage of half the magnitude of the supply voltage when the NMOS transistor and the PMOS transistor of the output inverter have one of the transistor corners of typical-typical (TT), fast-fast (FF), and slow-slow (SS).

19. The electronic circuit of claim 17, wherein the common mode voltage control circuit is configured to apply to the first node the common mode voltage of a magnitude less than half of the supply voltage when the NMOS transistor and the PMOS transistor of the output inverter have the transistor corner of fast-slow (FS).

20. The electronic circuit of claim 16, wherein the common mode voltage control circuit is configured to apply to the first node the common mode voltage of a magnitude greater than half of the supply voltage when the NMOS transistor and the PMOS transistor of the output inverter have a transistor corner of slow-fast (SF).

* * * * *